United States Patent

Masuda et al.

[11] Patent Number: 6,110,639
[45] Date of Patent: *Aug. 29, 2000

[54] RADIATION-SENSITIVE COMPOSITION AND RECORDING MEDIUM USING THE SAME

[75] Inventors: Seiya Masuda; Satoru Funato; Natsumi Kawasaki, all of Saitama, Japan

[73] Assignee: Hoechst Japan Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/860,451
[22] PCT Filed: Dec. 28, 1995
[86] PCT No.: PCT/JP95/02764
   § 371 Date: Jun. 26, 1997
   § 102(e) Date: Jun. 26, 1997
[87] PCT Pub. No.: WO96/20432
   PCT Pub. Date: Jul. 4, 1996

[30] Foreign Application Priority Data

Dec. 28, 1994 [JP] Japan .................................. 6-340613

[51] Int. Cl.$^7$ .................................................. G03F 7/038
[52] U.S. Cl. ........................................ 430/270.1; 430/920
[58] Field of Search .................. 522/50, 52; 430/270.1, 430/920, 922, 924, 927, 921, 919

[56] References Cited

U.S. PATENT DOCUMENTS

| | | | |
|---|---|---|---|
| 3,912,606 | 10/1975 | Pacifici et al. | 204/159.15 |
| 3,954,475 | 5/1976 | Bonham et al. | 96/67 |
| 3,987,037 | 10/1976 | Bonham et al. | 260/240 |
| 4,845,011 | 7/1989 | Wilczak et al. | 430/281 |
| 5,070,001 | 12/1991 | Stahlhofen | 430/281 |
| 5,227,276 | 7/1993 | Roeschert et al. | 430/252 |
| 5,238,781 | 8/1993 | Shadeli | 430/270 |
| 5,338,641 | 8/1994 | Pawlowski et al. | 430/165 |
| 5,368,901 | 11/1994 | Leuschner et al. | 427/558 |
| 5,376,496 | 12/1994 | Elsaesser et al. | 430/165 |
| 5,614,351 | 3/1997 | Dammel et al. | 430/270.1 |
| 5,916,729 | 6/1999 | Kobayashi et al. | 430/270.1 |

FOREIGN PATENT DOCUMENTS

| | | | |
|---|---|---|---|
| 0 423 446 | 4/1991 | European Pat. Off. . | |
| 0 537 524 | 4/1993 | European Pat. Off. . | |
| 620500 | 10/1994 | European Pat. Off. | G03F 7/004 |
| 62-209451 | 9/1987 | Japan | G03C 1/72 |

OTHER PUBLICATIONS

European Patent Office internet esp@cenet abstract of EP 0020248, Sep. 1982.
"Negative Type Photosensitive Composition" Patent Abstract of Japan 4-46344 (Feb. 1992).
"Resist Composition and Method for Patterning Using That" Patent Abstract of Japan 5-45879 (Feb. 1993).
"Negative Photoresist Composition" Patent Abstract of Japan 5-88366 (Apr. 1993).
"Chemically Amplified Type Resist and Method for Froming Resist Pattern" Patent Abstract of Japan 5-216233 (Aug. 1993).
J. Crivello "Possibilities for Photoimaging Using Onium Salts" *Polymer Engineering and Science* 23:953–956 (1983).
WPIDS, WPAT English abstracts of JP 62–209451, Sep. 1987.

*Primary Examiner*—Janet Baxter
*Assistant Examiner*—Rosemary Ashton
*Attorney, Agent, or Firm*—Foley & Lardner

[57] ABSTRACT

A radiation-sensitive composition comprising:

an acid-generating compound capable of generating an acid upon exposure to radiation and represented by the formula (I):

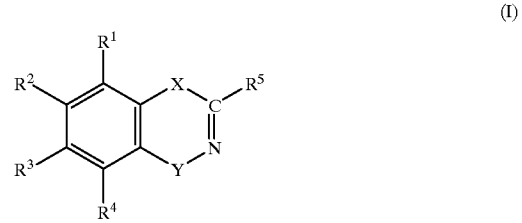

wherein X, Y and $R^1$ to $R^5$ have the following meanings:

X and Y: independently a direct bond, $C_1$–$C_8$ alkylene, $C_1$–$C_4$ alkene, —O—$R^{11}$—O— (wherein $R^{11}$ is an alkylene group having 1 to 4 carbon atoms), —NH—, —O—, —S—, —SO$_2$—, —CO—, —COO— or —CONR$^{12}$— (wherein $R^{12}$ is a hydrogen atom, $C_1$–$C_8$ alkyl, alkylaryl, halogenated alkyl, halogenated aryl, a halogen atom, alkoxy, phenoxy, alkylsulfonyl-oxy, halogenated alkylsulfonyl-oxy, or substituted or unsubstituted arylsulfonyl-oxy);

$R^1$ to $R^4$: a hydrogen atom, $C_1$–$C_{18}$ alkyl, aryl, heteroaryl, a halogen atom, alkyl-substituted or aryl-substituted amino, alkyl-substituted or aryl-substituted amido, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated alkyl, halogenated aryl, halogenated hetero-aryl, alkylsulfonyl-oxy, halogenated alkylsulfonyl-oxy, or substituted or unsubstituted arylsulfonyl-oxy;

a water-insoluble but aqueous alkaline solution-soluble binder; and a cross-linking compound capable of reacting with said binder in the presence of said acid to cause the binder to be cross-linked. Further, a radiation-sensitive recording medium can be obtained by forming a layer made of the radiation-sensitive composition on a substrate.

11 Claims, No Drawings

RADIATION-SENSITIVE COMPOSITION AND RECORDING MEDIUM USING THE SAME

TECHNICAL FIELD

The present invention relates to a resist composition which is sensitive to an irradiation and a recording medium using the radiation-sensitive composition. More particularly, the invention relates to a negative-type resist composition which is sensitive to a high-energy radiation such as a KrF excimer laser, an X-ray or an electron beam. The resist composition according to the present invention is capable of exhibiting a high radiation sensitivity, a high resolution and an excellent process stability, and useful especially for the production of semiconductors, micron-order processing of optical masks or the like. Also, the recording medium according to the present invention is suitably applied to the production of semiconductors, printed circuit boards, integrated circuits, optical masks, liquid crystal devices, printing plates or the like.

BACKGROUND ART

In DE-B-3907953.8, DE-B-4112972.5, DE-B-4112968, DE-B-41129695 and U.S. Pat. No. 4,491,628, there have been disclosed radiation-sensitive mixtures which comprise a compound capable of generating an acid by the exposure to radiation, a water-insoluble but aqueous alkaline solution-soluble binder, and a compound which causes a cross-linking reaction (negative-type) or a decomposition reaction (positive-type) in the presence of an acid. These mixtures generate an acid upon exposure to radiation and, after the exposure, heat-treated to cause components thereof to be cross-linked with each other (negative-type) or decomposed (positive type) by catalytic effects of the acid generated to increase the difference in solubility to an aqueous alkaline solution between exposed and unexposed area thereof, thereby producing micro-patterns.

Although the conventional radiation-sensitive mixtures have a sensitivity and resolution sufficient to produce fine semiconductors, there arises a problem that the sensitivity and the definition thereof becomes deteriorated as the period between the exposure and a post-exposure baking step is prolonged. It is suggested that this problem is caused due to the fact that the acid generated by the exposure to radiation is diffused from the exposed area to the unexposed area, thereby rendering acid-latent images produced by the exposure unstable. In general, resist mixtures are required to be kept stable for the period between the exposure and the post-exposure baking step, e.g., for about two hours in the case of the production of semiconductors or for about twenty-four hours in the case of the production of optical masks.

DISCLOSURE OF THE INVENTION

The present invention has been made to eliminate the afore-mentioned problems encountered in the prior art.

In one aspect of the present invention, there is provided a radiation-sensitive composition comprising:

an acid-generating compound capable of generating an acid upon exposure to radiation and represented by the formula (I):

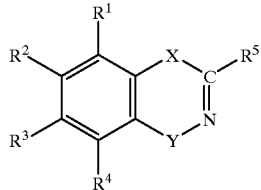

wherein X, Y and $R^1$ to $R^5$ have the following meanings:

X and Y: independently a single bond, $C_1$–$C_8$ alkylene, $C_1$–$C_4$ alkene, —O—$R^{11}$—O— (wherein $R^{11}$ is an alkylene group having 1 to 4 carbon atoms), —NH—, —O—, —S—, —SO$_2$—, —CO—, —COO— or —CONR$^{12}$— (wherein $R^{12}$ is a hydrogen atom, $C_1$–$C_{18}$ alkyl, alkylaryl, halogenated alkyl, halogenated aryl, a halogen atom, alkoxy, phenoxy, alkylsulfonyl-oxy, halogenated alkylsulfonyl-oxy, or substituted or unsubstituted arylsulfonyl-oxy);

$R^1$ to $R^4$: a hydrogen atom, $C_1$–$C_{18}$ alkyl, aryl, heteroaryl, a halogen atom, alkyl-substituted or aryl-substituted amino, alkyl-substituted or aryl-substituted amido, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated alkyl, halogenated aryl, halogenated hetero-aryl, alkylsulfonyl-oxy, halogenated alkylsulfonyl-oxy, or substituted or unsubstituted arylsulfonyl-oxy;

a water-insoluble but aqueous alkaline solution-soluble binder; and a cross-linking compound capable of reacting with the binder in the presence of the acid to cause the binder to be cross-linked.

In addition, in another aspect of the present invention, there is provided a radiation-sensitive recording medium comprising a substrate, and a coating layer formed on the substrate and made of the above-mentioned radiation-sensitive composition.

The present invention is described in detail below.

The afore-mentioned nitrogen-containing heterocyclic compound contains an imino group therein and therefore exhibits a basicity. The nitrogen-containing heterocyclic compound neutralizes an acid generated from an exposed area thereof, thereby preventing the acid from being diffused for the period between the exposure and the baking step. As a result, the acid-latent images formed on the exposed area can be stabilized.

Compounds having a halogenated alkyl group or a halogenated alkylsulfonyl-oxy group can be especially suitably used as the acid-generating compound, because these compounds are capable of not only generating an acid when exposed to radiation, especially an X-ray and an electron beam, but also causing a cross-linking reaction with the binder. For this reason, the acid-generating compounds can exhibit a much higher sensitivity as compared to the conventional acid-generating agents which serve merely for generating an acid by the exposure to radiation.

Also, the preferred acid-generating compounds may be those in which one of the radicals X and Y in the formula (I) constitutes nitrogen-substituted or unsubstituted amido bond. That is, the amido bond contributes to the improvement in polarity of the acid-generating compound, prevents the unexposed area in the radiation-sensitive mixture from being deteriorated in rate of solubility, and increases the contrast between the exposed and unexposed area, thereby enabling good formation of patterns.

In addition, the afore-mentioned acid-generating compounds are preferably those compounds which contain halogenated alkyl, halogenated aryl, alkylsulfonyl-oxy, or substituted or unsubstituted arylsulfonyl-oxy as at least one of the radicals $R^5$ and $R^{12}$ in the formula (I).

Further, the acid-generating compounds are preferably benzimidazole compounds, quinazolinone compounds and quinoline compounds represented by the below-mentioned formulae (III) to (V):

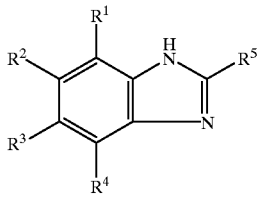

(III)

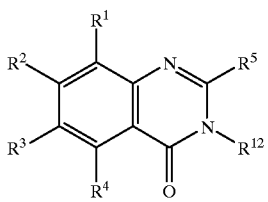

(IV)

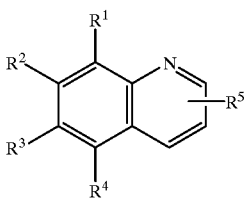

(V)

wherein $R^1$ to $R^5$ and $R^{12}$ have the same meanings as described above.

Examples of the especially preferred acid-generating compounds may include 2-trifluoromethyl-benzimidazole, 2-monofluoro-dichloromethyl-benzimidazole, 2-difluoromonochloromethyl-benzimidazole, 2-monochloromethylbenzimidazole, 2-dichloromethyl-benzimidazole, 2-trichloromethyl-benzimidazole, 2-monobromomethylbenzimidazole, 2-dibromomethyl-benzimidazole, 2-tribromomethyl-benzimidazole, 2-monochloromethyl-4(3H)-quinazolinone, 2-monochloroethyl-4(3H)-quinazolinone, 2-dichloromethyl-4(3H)-quinazolinone, 2-dichloroethyl-4(3H)-quinazolinone, 2-trichloromethyl-4(3H)-quinazolinone, 2-monobromomethyl-4(3H)-quinazolinone, 2-dibromomethyl-4(3H)-quinazolinone, 2-tribromomethyl-4(3H)-quinazolinone, 2-methyl-3-trifluoromethyl-sulfonyloxy-4-quinazolinone, 2-methyl-3-phenyl-sulfonyloxy-4-quinazolinone, 2-methyl-3-tosyloxy-4-quinazolinone, 2-phenyl-3-tosyloxy-4-quinazolinone, α,α,α-trichloroquinoline, α,α,α-tribromoquinoline, or the like.

The content of the acid-generating compound represented by the formula (I) is usually in the range of 0.5 to 30% by weight, preferably 3 to 20% by weight, based on the total weight of the radiation-sensitive mixture.

The acid-generating compound according to the present invention can be used in combination with other conventional acid-generating agents. Examples of the other conventional acid-generating agents which are capable of generating an acid by the exposure to radiation may include, onium salts such as diazonium salts or sulfonium salts, especially, $HSbF_6$, $HAsF_6$ or $HPF_6$ [refer to J. V. Crivello, Polym. Eng. Sci., 23, (1983)953], and organic acids such as alkylsulfonic acid or perfluoro-alkylsulfonic acid, trichloro-acetyl-phenol, tribromo-phenyl-sulfone (refer to DE-A-3503113), and triazine compounds such as tris (trichloromethyl)-s-triazine, tris(tribromomethyl)-s-triazine, 2,4-bis(trichloromethyl)-6-styryl-triazine, 2,4-bis (trichloromethyl)-6-styryltriazine (refer to JP-B-57-1819), derivatives of 2,4-bis(trichloromethyl)-s-triazine (refer to DE-A-3337024.9) or 2,4,6-tris(-2-hydroxy-ethoxy)-triazine esterified with hetero-aryl-sulfonic acid (refer to JP-A-5-197150), compounds such as α,α-bis(arylsulfonyl)-diazomethane or α,α-bis(arylsulfonyl)-methane (refer to JP-A-3-103854), mono-, di- or tri-(hydroxyphenyl)-methane whose aromatic ring has at least one halogen substituent, mono-, di- or tri(hydroxyphenyl)-ethane whose aromatic ring has at least one halogen substituent, or the like. The afore-mentioned acid-generating compounds can be used singly or in the form of a mixture of any two or more thereof.

The binders used in the radiation-sensitive composition according to the present invention can be suitably selected depending upon kind of radiation applied. In the case of X-ray-sensitive and electron beam-sensitive compositions, there can be used novolak resins produced by the condensation of m-cresol and aldehyde, preferably such novolak resins produced by condensing a mixture containing m-cresol and one or more secondary phenols selected from p-cresol, 2,4-xylenol, 2,5-xylenol and 3,5-xylenol, with aldehyde. The weight ratio of m-cresol to the secondary phenol is preferably in the range of 85:15 to 35:65, more preferably 75:25 to 45:55 (% by weight). The preparation of the novolak resins can be carried out by a known method in which m-cresol or, if required, the mixture of m-cresol and the afore-mentioned phenol is reacted with aldehyde while heating in the presence of an acid catalyst (for example, oxalic acid).

The molecular weight of the novolak resin is in the range of 2,000 to 100,000, preferably 2,000 to 50,000, more preferably 3,000 to 20,000 when calculated as a weight-average molecular weight in terms of polystyrene. When the molecular weight is less than 2,000, the resist pattern cannot exhibit a sufficient cross-linking density. As a result, the remaining film thickness thereof is extremely lowered so that, in the worst case, all of images formed on the composition are disadvantageously eliminated. On the other hand, when the molecular weight is more than 100,000, the cross-linking density thereof becomes too high, so that the composition is readily cross-linked merely by heating, which causes such an inconvenience that the unexposed area cannot be completely dissolved to an alkaline developer.

As binders for deep UV radiation-sensitive compositions (the UV radiation has a wavelength of 200 to 300 nm), resins capable of exhibiting a high transparency in the wavelength region of the UV radiation can be suitably used instead of the afore-mentioned novolak resins from the standpoint of optical characteristics thereof. These resins can be used singly or in the form of a mixture of any two or more thereof. Examples of the preferred transparent binders may include homopolymers or copolymers of p-hydroxy-styrene or its alkyl derivatives, e.g., 3-methyl-4-hydroxy-styrene, homopolymers or copolymers of other vinyl phenol, e.g., 3-hydroxy-styrene, and homopolymers or copolymers of esters of acrylic acid with a phenol group-containing aromatic compound, or acrylic amide. In this case, polymeric compounds such as methyl methacrylate can be used as a co-monomer.

The molecular weight of the afore-mentioned poly (hydroxy-styrene)-based resins is usually in the range of 2,000 to 100,000, preferably 2,000 to 50,000, more preferably 3,000 to 20,000 when calculated as a weight-average molecular weight in terms of polystyrene. When the molecular weight is less than 2,000, the resist pattern cannot exhibit a sufficient cross-linking density. On the other hand, when the molecular weight is more than 100,000, the resist pattern is readily cross-linked merely by heating.

Also, silicon-containing vinyl monomers, e.g., vinyl-trimethyl silane, can be used as the binder. In this case, a composition having a high resistance to plasma etching can be obtained. Since these binders generally have a high transparency in the afore-mentioned wavelength range, it is possible to accomplish good formation of images.

In addition, homopolymers or copolymers of maleimides can be effectively used as the binder. These binders can also show a high transparency in the afore-mentioned wavelength range. Examples of co-monomers suitably used with the maleimides may include styrene, substituted styrene, vinyl phenol, propenyl phenol, vinyl ethers, vinyl esters, vinyl silyl compounds or acrylic or methacrylic acid esters. Incidentally, styrene copolymers can be used together with a co-monomer which can increase their solubility in the aqueous alkaline solution. Such a co-monomer may include maleic anhydride and maleic acid half ester.

These binders can be used in the form of a mixture unless the mixing thereof decreases an optical property of the radiation-sensitive mixture.

The content of the binder in the radiation-sensitive composition is usually in the range of 40 to 95% by weight, preferably 50 to 95% by weight, based on the total weight of a solid content in the radiation-sensitive composition.

As the cross-linking compounds, there can be used resol described in GB 2082339; alkoxymethyl- or oxiranyl-methyl-substituted aromatic compounds (refer to EP-A-0212482); monomeric or oligomeric melamine/formaldehyde condensates and urea/formaldehyde condensates (refer to EP-A-0133216, DE-A-3634371 or DE-A-3711264); and the like. Specifically, examples of the cross-linking compounds may include commercially available resol products such as Bakelite R5363, Bakelite R17620 and KALREZ 40-152 ("Bakelite" and "KALREZ" are trade names).

More preferred cross-linking compounds are those known from EP-A-0212482 and represented by the below-mentioned formula (II):

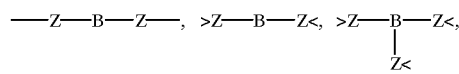

wherein A, $R^6$ to $R^9$, m and n have the following meanings:

$R^6$ and $R^{8:}$ independently a hydrogen atom, $C_1$–$C_6$ alkyl, $C_1$–$C_9$ aliphatic unsaturated carbonyl, $C_5$–$C_6$ cycloalkyl, substituted or unsubstituted $C_6$–$C_{12}$ aryl, $C_6$–$C_{12}$ aralkyl or acyl;

$R^7$ and $R^9$: a direct bond, $C_1$–$C_4$ alkylene whose chain may be partially substituted with —N—, —O—, —CO— or —CONH—, or substituted or unsubstituted phenylene;

A: an (m+n)-valent organic group having an aromatic group or a heterocyclic group;

n: an integer of 1 to 3; and m: an integer of 0 to 3, proviso that n+m is at least 2.

The radical "A" in the formula (II) is preferably those represented by the formula of B-(Z)$_p$ [where B stands for a substituted or unsubstituted p-valent benzene ring, a substituted or unsubstituted p-valent heterocyclic group containing one or more oxygen atoms, nitrogen atoms and/or sulfur atoms; Z stands for a direct bond, 2- or 3-valent $C_1$–$C_4$ alkyl, —O—$R^{13}$—O— (where $R^{13}$ is $C_1$–$C_4$ alkylene or phenylene), substituted or unsubstituted phenylene, —N—, —NH—, —O—, —S—, —SO$_2$—, —CO—, —COO— or —CONH—; and p is an integer of 1 to 4], or —B—Z—B— (where B and Z have the same meanings as described above). The radical A may include, for example, those having the structural formulae such as

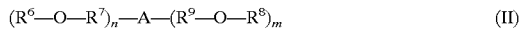

or the like.

Typical compounds represented by the formula (II) may include aromatic and heterocyclic compounds having multiple substituents selected from hydroxy-methyl, acetoxy-methyl, methoxy-methyl and butoxy-methyl. The preferred commercially available cross-linking compounds may include, for example, CYMEL (Registered Trademark) 300 (manufactured by Mitsui Cytec, Ltd.), CYMEL 303 (manufactured by Mitsui Cytec, Ltd.), NIKALAC MW-30HM (manufactured by Sanwa Chemical Co., Ltd.), NIKALAC MW-40 (manufactured by Sanwa Chemical Co., Ltd.), NIKALAC MX-302 (manufactured by Sanwa Chemical Co., Ltd.), BX-4000 (manufactured by Sanwa Chemical Co., Ltd.). The methylol group-containing aromatic compounds as the commercially available cross-linking compounds may include 2,6-dimethylol P-CR (manufactured by Honshu Chemical Industry, Co., Ltd.), 2,6-dimethylol PTBP (manufactured by Honshu Chemical Industry, Co., Ltd.), dimethylol PSBP (manufactured by Honshu Chemical Industry, Co., Ltd.), trimethylol 35-XL (manufactured by Honshu Chemical Industry, Co., Ltd.), or the like. The afore-mentioned cross-linking compounds can be used singly or in the form of a mixture of any two or more thereof. The content of the cross-linking compound in the radiation-sensitive composition is in the range of 1 to 50% by weight, preferably 3 to 30% by weight, based on the total weight of the solid content in the radiation-sensitive composition.

If appropriately, various additives such as dyes, pigments, plasticizers, wetting agents or flow-controlling agents can be added to the radiation-sensitive composition in order to enhance properties such as elasticity, adhesion or luster.

Further, if appropriately, a basic compound as the additive may be mixed with the radiation-sensitive composition in order to reduce the diffusion of acid. Such basic compounds may be primary-, secondary- or tertiary amines, and quaternary ammonium salts. Specific examples of these basic compounds may include tetramethyl hydroxide ammonium, tetraethyl hydroxide ammonium, aromatic amines, heterocyclic compounds such as pyridine derivatives, imidazole derivatives, quinazoline derivatives, pyrrole derivatives or piperidine derivatives, 1,8-diaza-bicyclo[5.4.0]-7-undecene, 1,5-diazabicyclo[4.3.0]-5-nonane, benzylidene-aniline derivatives, spiro-pyrane derivatives or the like. These basic compounds can be used singly or in the form of any two or more thereof. However, it should be noted that, in general, if such a basic substance is added to the composition, the radiation-sensitive composition tends to be deteriorated in sensitivity to the radiation.

Radiation-decomposing basic substances, for example, triphenyl sulfonium hydroxide, bis (4-t-butylphenyl) iodonium hydroxide, triphenyl sulfonium acetate, bis(4-t- butylphenyl)iodonium acetate or the like, can be added to the composition in order to further enhance a processing stability thereof. These radiation-decomposing basic substances can be used singly or in the form of a mixture of any two or more thereof.

The content of the afore-mentioned basic substance which serves for reducing the diffusion of the acid, is in the range of 10 mol % to 300 mol %, preferably 50 mol % to 100 mol %, based on the acid-generating compound contained in the radiation-sensitive composition.

By coating the radiation-sensitive composition according to the present invention onto a substrate, a radiation-sensitive recording medium usable for the production of semiconductors, printed circuit boards, integrated circuits, optical masks, liquid crystal devices, printing plates or the like, can be produced. In this case, it is preferred that the radiation-sensitive composition be dissolved in a solvent. Examples of the preferred solvents suitably used for such a purpose may include ethylene glycol, propylene glycol or alkyl and dialkyl ethers derived from or these glycols, especially monomethyl or diethyl ether; esters derived from aliphatic ($C_1$–$C_6$) carboxylic acids and ($C_1$–$C_8$) alkanols, ($C_1$–$C_8$) alkane diols or ($C_1$–$C_6$) alkoxy-($C_1$–$C_8$) alkanols, e.g., ethyl acetate, hydroxy-ethyl acetate, alkoxy-ethyl acetate, n-butyl acetate, propylene glycol-monoalkyl ether acetate, especially propylene glycol-monomethyl ether acetate and amyl acetate; ethers, for example, tetrahydroxy furan and dioxane; ketones, for example, methyl ethyl ketone, methyl-iso-butyl ketone, cyclopentanone and cyclohexanone; N,N-dialkyl carboxylic acid amide, for example, N,N-dimethyl formamide, N,N-dimethyl acetamide and hexamethyl phosphotriamide; N-methylpyrrolidine-2-one; butyrolactone; and a mixture thereof. Among these compounds, glycol ethers and aliphatic esters are especially preferable.

The solution prepared by using the afore-mentioned solvent may have a solid content of 5 to 60% by weight, preferably up to 50% by weight. The solid content of the solution can be finally optimized by appropriately selecting coating method, desired layer thickness and drying conditions of the process used.

As the substrate onto which the thus-prepared solution is coated, any conventional materials can be used for the production of capacitors, semiconductors, multi-layer printed circuits or integrated circuits. Doped silicon substrate thermally oxidized and/or coated with aluminum can be especially preferably used for this purpose. In addition, other substrates generally used in semiconductor techniques, such as silicon nitride, arsenic gallium and indium phosphide can also be used. As substrates for optical masks, there can be suitably used glass or quartz plates on which metal such as chromium or chromium oxide is deposited. Further, there can also be used materials known for the production of liquid crystal devices, for example, glass and indium-tin oxide, metal plates or metal foils, for example, aluminum, copper and zinc, two- or three-layered metal foils, or non-conductive sheet or paper on which metal is deposited, or the like. These substrates can be subjected to pre-treatments such as thermal pre-treatment, surface-roughening treatment, surface-etching treatment, or reagent treatment in order to desirably improve properties thereof or strengthen the adhesion between the substrate and the radiation-sensitive mixture.

The adhesion of the radiation-sensitive layer to a surface of the substrate can be improved by incorporating an adhesion-promoting agent in the radiation-sensitive layer. In the case of silicon or silica substrate, aminosilane-type adhesion-promoting agent, e.g., aminosilanes such as 3-aminopropyl-ethoxy-silane or hexamethyl disilazane can be used for this purpose.

As supports or substrates suitable for recording media such as printing plates used in letter-press printing, litho printing, screen printing and flexo-graphic printing, there can be used aluminum plates which may be preliminarily anodized, surface-grained and/or treated with silicates, zinc plates, steel plates which may be chrome-plated, plastic sheets, or papers.

The solution of the radiation-sensitive composition can be applied onto the substrate by spraying, curtain flow coating, roll coating, rotary coating and dip coating. Successively, the solvent contained in the coated solution is removed by evaporation to form a radiation-sensitive layer on the substrate. The removal of the solvent can be accelerated by heating a layer of the coated solution up to 150° C. Alternatively, after the solution of the radiation-sensitive composition is applied onto a temporary substrate by any of the afore-mentioned coating methods, the layer of the coated solution can be transferred onto a final substrate by applying a pressure and an elevated temperature thereto. In the latter case, any optional materials can be used for the temporary substrate. The thickness of the radiation-sensitive layer may be varied depending upon application fields thereof, but usually in the range of 0.1 to 100 μm, preferably 0.3 to 10 μm, especially preferably 0.5 to 1.5 μm.

In practice, the thus-prepared radiation-sensitive recording medium is exposed to an active radiation so as to project and form images thereon. The suitable sources of such an irradiation may include a halogen-metal lamp, a carbon-arc lamp, a xenon lamp and a mercury vapor lamp. Further, laser beam sources, for example, excimer laser, especially KrF- or ArF-excimer laser irradiated at a wavelength of 248 nm or 193 nm, can be suitably used as the radiation source. Furthermore, it is preferred that the radiation-sensitive recording medium be exposed to a high-energy radiation such as an X-ray or an electron beam.

After exposure to the radiation, the radiation-sensitive recording medium is subjected to baking. That is, the radiation-sensitive recording medium is heated at 90° C. to 150° C. for 1 to 30 minutes, thereby enabling a cross-linking reaction of the radiation-sensitive composition to be promoted to a large extent. As a result, a radiation-sensitive mixture having a high sensitivity, a high contrast and a high resolution can be obtained. Thereafter, the radiation-sensitive recording medium is treated with a developing solution to dissolve an unexposed region of the radiation-sensitive composition in the developing solution and remove it therefrom, so that images consistent with original images used in the image-exposure step can be formed on the surface of the substrate.

Examples of the suitable developing solutions may include aqueous solutions containing silicates, metasilicates, hydroxides, borates, hydrogen-phosphates, dihydrogen-phosphates, carbonates or hydrogen-carbonates of alkali metal ion, alkali-earth metal ion and/or ammonium ion; ammonia; or the like. In addition, developing solutions containing no metal ion are described in U.S. Pat. No. 4,729,941, EP-A-0062733, U.S. Pat. No. 4,141,733, EP-A-0097282 and EP-A-0023758. The amount of these materials contained in the developing solution is usually in the range of 0.1 to 15% by weight, preferably 0.5 to 5% by weight, based on the weight of the developing solution. The use of the developing solution containing no metal ion is preferable. In order to facilitate the separation of the soluble region of the radiation-sensitive layer, the developing solution can contain a small amount of a wetting agent, a surface-active agent or the like.

The developed resist pattern layer may be post-cured, if desired. This treatment is generally conducted by heating, on a hot plate, the resist pattern layer to a temperature lower than the flow temperature thereof, and then exposing the entire surface of the layer to light from a xenon-mercury vapor lam (200–250 nm region). By this post-curing treatment, the resist pattern layer is crosslinked, and thus imparted with flow resistance which is effective, in general, at a temperature of 200° C. or lower.

BEST MODE FOR CARRYING OUT THE INVENTION

The present invention is described in more detail below by way of examples. Incidentally, performance evaluations of the products obtained in respective examples have been carried out by the following methods.

[Evaluation Example 1]

A radiation-sensitive composition was coated onto a silicon wafer surface-treated with hexamethyl disilazane by means of a spin coater. The coated radiation-sensitive composition was baked and dried at a baking temperature of 100° C. for 60 seconds to form a radiation-sensitive layer having a thickness of 0.5 $\mu$m on the silicon wafer. The thus-obtained radiation-sensitive layer was exposed to an electron beam emitted from an electron beam-exposing apparatus "ELS-6600B" manufactured by Elionix Corp. at an accelerating voltage of 20 kV. Thereafter, the radiation-sensitive layer was subjected to a post-exposure baking treatment at 100° C. for 120 seconds to increase a sensitivity thereof and then immersed in an aqueous alkaline developing solution (prepared by diluting 1.39N solution "AZ400K" manufactured by Hoechst AG with a deionized water at a mixing ratio of 1:4) for 60 seconds to produce patterns on the layer.

[Evaluation Example 2]

In order to evaluate a stability of the radiation-sensitive composition during stand-by periods between the aforementioned processes, the sensitivity thereof and dimensional fluctuation in line width of a pattern formed thereon, which occurred after allowing the composition to hold for 24 hours during each of the below-mentioned periods between the respective processes, were measured. The stability was evaluated by determining the difference between a measured value at a holding time of 0 hour and that after a holding time of 24 hours.

H1b: Between baking and exposure (within the exposing apparatus: in vacuo)

H2b: Between exposure and post-exposure baking (within the exposing apparatus: in vacuo)

H2a: Between exposure and post-exposure baking (in air)

H3: Between post-exposure baking and development (in air)

EXAMPLE 1

A mixture comprising 83.0% by weight of a novolak resin (having an average molecular weight of about 8,900) prepared by the condensation polymerization of m-cresol, p-cresol, 2,4-xylenol and 2,5-xylenol with formaldehyde, 8.3% by weight of hexamethyl methylol melamine ("MW-30HM" manufactured by Sanwa Chemical Co., Ltd.) and 8.7% by weight of 2-trichloromethyl-4(3H)-quinazolinone (manufactured by Aldrich Corp.) were dissolved in propylene glycol-methyl ether acetate and the solution was filtered through 0.2 $\mu$m membrane filter to prepare a radiation-sensitive composition.

The thus-prepared radiation-sensitive composition was coated, exposed to radiation and developed according to the method described in Evaluation Example 1 to obtain 0.4 $\mu$m fine line and space pattern. The remaining film thickness was 90% at a sensitivity of 0.8 $\mu$C/cm$^2$. Also, the contrast $\gamma$ of the pattern image was calculated according to the following formula:

$$\gamma = 1/(\log D100/Di)$$

wherein D100 represents an amount of exposure at a residual film rate of 100% extrapolated from a linear segment of the sensitivity curve, and Di represents an amount of exposure required for the initial formation of images.

The results of the evaluation are shown in Table 1.

In addition, the above-prepared radiation-sensitive composition was tested according to Evaluation Example 2 to evaluate the stability between the processes. The maximum fluctuations in line width of 1.25 $\mu$m line pattern were as follows.

H1b: + 0.01 $\mu$m

H2b: + 0.01 $\mu$m

H2a: – 0.02 $\mu$m

H3: ± 0 $\mu$m

The observed fluctuations in line width were within experimental error and therefore it was found that the radiation-sensitive composition had an extremely high process stability.

EXAMPLES 2 to 8

The radiation-sensitive compositions were prepared in the same manner as in Example 1 except that the percentages of respective components were changed from those of Example 1 as shown in Table 1. The obtained compositions were tested to evaluate the performance thereof according to Evaluation Example 1. The results are shown in Table 1. In addition, the radiation-sensitive compositions obtained in Examples 2 to 8 were subjected to performance evaluation tests according to Evaluation Example 1. As a result, any of the radiation-sensitive compositions obtained in Examples 2 to 8 showed no remarkable fluctuation in sensitivity and line width of the pattern similarly to that of Example 1.

EXAMPLE 9

The radiation-sensitive composition was prepared in the same manner as in Example 1 except that a benzoguanamine-based cross-linking agent "BX-4000" (manufactured by Sanwa Chemical Co., Ltd.) was used instead of hexamethyl-methylol-melamine of Example 1. The obtained composition was tested to evaluate the performance thereof in the same manner as in Evaluation Example 1 except that the development was carried out for 60 seconds by using a developing solution having a mixing ratio of AZ400K to deionized water of 1:3. The results are shown in Table 1.

EXAMPLE 10

The radiation-sensitive composition was prepared in the same manner as in Example 1 except that a mixed ether-based cross-linking agent "MX-40" (manufactured by Sanwa Chemical Co., Ltd.) was used instead of hexamethyl-methylol-melamine of Example 1. The obtained composition was tested to evaluate the performance thereof in the same manner as in Evaluation Example 1 except that the development was carried out for 60 seconds by using a developer having a mixing ratio of AZ400K to deionized water of 1:3. The results are shown in Table 1.

EXAMPLE 11

The radiation-sensitive composition was prepared in the same manner as in Example 1 except that an acrylmelamine-based cross-linking agent "MX-302" (manufactured by Sanwa Chemical Co., Ltd.) was used instead of hexamethyl-methylol-melamine of Example 1. The obtained composition was tested to evaluate the performance thereof in the same manner as in Evaluation Example 1 except that the development was carried out for 60 seconds by using a developing solution having a mixing ratio of AZ400K to deionized water of 1:3. The results are shown in Table 1.

In addition, the radiation-sensitive compositions obtained in Examples 9 to 11 were subjected to performance evaluation tests in the same manner as in Evaluation Example 2. As a result, any of the radiation-sensitive compositions obtained in Examples 9 to 11 showed no remarkable fluctuation in sensitivity and line width of the pattern similarly to that of Example 1.

Comparative Example 1

The radiation-sensitive composition was prepared in the same manner as in Example 1 except that tribromomethylphenyl sulfoxide was used instead of quinazoline of Example 1. When subjected to performance evaluation tests under the same process conditions as described in Evaluation Example 1, an unexposed area of the obtained composition could not be completely dissolved in the developing solution, thereby failing to form a pattern. The pattern formation could be accomplished only by using a developer having such a rate of dilution as given by a ratio of AZ400K to deionized water of 1:2 instead of that described in Evaluation Example 1, and by conducting the development process for 150 seconds which were two times the time required for completely dissolving the unexposed area. The sensitivity of the radiation-sensitive composition was 3.0 $\mu C/cm^2$ at a residual film rate of 90%, and therefore lower than any of the residual film rates of the radiation-sensitive compositions obtained in Examples 1 to 8. When observed in section, the resist pattern formed had a rounding top pattern shape and undesirably fotting at a bottom thereof. In addition, when the radiation-sensitive composition of Comparative Example 1 was evaluated according to Evaluation Example 2, the dimensional fluctuation in line width of not less than 0.05 $\mu m$ was observed during the period between the exposure step and the post-exposure baking step.

Comparative Example 2

The radiation-sensitive composition was prepared in the same manner as in Example 1 except that 2-(p-methoxyphenyl)-4,6-bis(trichloromethyl)-1,3,5-triazine was used instead of quinazoline of Example 1. When subjected to performance evaluation tests under the same process conditions as described in Evaluation Example 1, an unexposed area of the obtained composition could not be completely dissolved in the developer, thereby failing to form a pattern. The pattern formation could be accomplished only by using a developer having such a rate of dilution as given by a ratio of AZ400K to deionized water of 1:2 instead of that described in Evaluation Example 1, and by conducting the developing process for 150 seconds which were two times the time required for completely dissolving the unexposed area. The radiation-sensitive composition had a high sensitivity of 0.8 $\mu C/cm^2$ at a residual film rate of 90%, but the contrast of the pattern formed thereon was lower than any of the contrasts of the patterns obtained in Examples 1 to 8. As a result, any line pattern having a line width of not less than 1.5 $\mu m$ could not be obtained at a residual film rate of not less than 90%, thereby resulting in considerably deteriorated resolution.

TABLE 1

| | Novolak resin (wt %) | Cross-linking agent (wt %) | Acid-generating agent (wt %) | Exposure at 90% residual film rate ($\mu C/cm^2$) | Contrast γ |
| --- | --- | --- | --- | --- | --- |
| Example 1 | 83.0 | 8.3 | 8.7 | 0.8 | 1.9 |
| Example 2 | 83.0 | 10.0 | 7.0 | 0.7 | 2.0 |
| Example 3 | 83.0 | 15.0 | 2.0 | 1.1 | 1.8 |
| Example 4 | 83.0 | 11.7 | 5.3 | 0.8 | 2.1 |
| Example 5 | 88.3 | 11.7 | 2.0 | 1.0 | 1.8 |
| Example 6 | 86.4 | 8.3 | 2.0 | 0.7 | 2.2 |
| Example 7 | 88.0 | 10.0 | 8.7 | 1.0 | 2.1 |
| Example 8 | 90.0 | 8.0 | 8.7 | 0.9 | 2.0 |
| Example 9 | 83.0 | 8.3 | 8.7 | 1.4 | 1.7 |
| Example 10 | 83.0 | 8.3 | 8.7 | 1.2 | 1.7 |
| Example 11 | 83.0 | 8.3 | 8.7 | 4.0 | 2.2 |
| Comparative Example 1 | 83.0 | 8.3 | 8.7 | 1.6 | 1.6 |
| Comparative Example 2 | 83.0 | 8.3 | 8.7 | 0.8 | 1.4 |

What is claimed is:

1. A radiation-sensitive composition consisting essentially of:

an acid-generating compound capable of generating an acid upon exposure to radiation and represented by the formula (I):

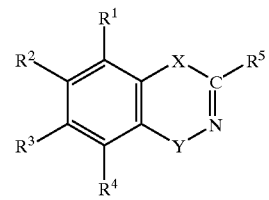

(I)

wherein X, Y and $R^1$ to $R^5$ have the following meanings:

X and Y: independently a direct bond, $C_1$–$C_{18}$ alkylene, $C_1$–$C_4$ alkene, —O—$R^{11}$—O— (wherein $R^{11}$ is an alkylene group having 1 to 4 carbon atoms), —NH—, —O—, —S—, —$SO_2$—, —CO—, —COO— or —$CONR^{12}$— (wherein $R^{12}$ is a hydrogen atom, $C_1$–$C_{18}$ is alkyl, alkylaryl, halogenated alkyl, halogenated aryl, a halogen atom, alkoxy, phenoxy, alkylsulfonyl-oxy, halogenated alkylsulfonyl-oxy, or substituted or unsubstituted arylsulfonyl-oxy);

$R^1$ to $R^4$: a hydrogen atom, $C_1$–$C_{18}$ alkyl, aryl, heteroaryl, a halogen atom, amino which may be substituted by an alkyl or aryl, amide which may be substituted by alkyl or aryl, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated alkyl, halogenated aryl, halogenated hetero-aryl, alkylsulfonyl-oxy, halogenated alkylsulfonyl-oxy, or substituted or unsubstituted arylsulfonyl-oxy;

a water-insoluble but aqueous alkaline solution-soluble binder comprising (i) novolak resins for X-ray or electron beam sensitive compositions or (ii) a water-insoluble but alkaline solution-soluble binder comprising a homopolymer or copolymer of p-hydroxystyrene or p-hydroxystyrene with one or more alkyl substituents on its benzene ring for deep UV sensitive compositions; and a cross-linking compound capable of reacting with said binder in the presence of said acid to cause the binder to be cross-linked.

2. A radiation-sensitive composition according to claim 1, wherein said cross-linking compound has at least one C—O—C bond.

3. A radiation-sensitive composition according to claim 1, wherein said cross-linking compound is represented by the formula (II):

$$(R^6\text{—O—}R^7)_n\text{—A—}(R^9\text{—O—}R^8)_m \qquad (II)$$

wherein A, $R^6$ to $R^9$, m and n have the following meanings:

$R^6$ and $R^8$: independently a hydrogen atom, $C_1$–$C_6$ alkyl, $C_1$–$C_9$ aliphatic unsaturated carbonyl, $C_5$–$C_6$ cycloalkyl, substituted or unsubstituted $C_6$–$C_{12}$ aryl, $C_6$–$C_{12}$ aralkyl or acyl;

$R^7$ and $R^9$: a direct bond or $C_1$–$C_4$ alkylene;

A: an (m+n)-valent organic group having an aromatic group or a heterocyclic group;

n: an integer of 1 to 3; and m: an integer of 0 to 3, proviso that n+m is at least 2.

4. A radiation-sensitive composition according to claim 3, wherein said radical "A" in the formula (II) is those represented by the formula of B—$(Z)_p$, where B stands for a substituted or unsubstituted p-valent benzene ring, or a substituted or unsubstituted p-valent heterocyclic group containing one or more oxygen atoms, nitrogen atoms and/or sulfur atoms; Z stands for a direct bond, 2- or 3-valent $C_1$–$C_4$ alkyl, —O—$R^{13}$—O— (where $R^{13}$ is $C_1$–$C_9$ alkylene or phenylene), substituted or unsubstituted phenylene, —N—, —NH—, —O—, —S—, —$SO_2$—, —CO—, —COO— or —CONH—; and p is 0 or an integer of 2 to 4, or —B—Z—B— (where B and Z have the same meanings as defined above).

5. A radiation-sensitive composition according to claim 3, wherein the content of said cross-linking compound in said composition is 1 to 50% by weight.

6. A radiation-sensitive composition according to claim 1, wherein said acid-generating compound is at least one selected from the group consisting of an benzimidazole compound, a quinazolinone compound and a quinoline compound represented by the formulae (III) to (V), respectively:

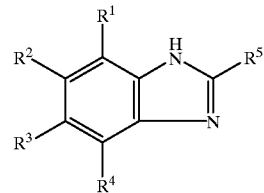
(III)

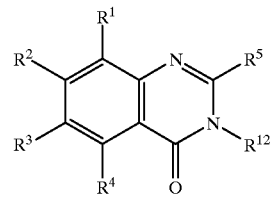
(IV)

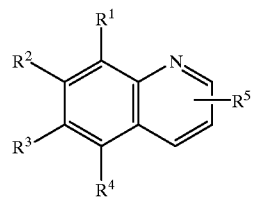
(V)

wherein $R^1$ and $R^5$ and $R^{12}$ have the same meanings as defined above.

7. A radiation-sensitive composition according to claim 6, wherein at least one of $R^5$ and $R^{12}$ is halogenated alkyl, halogenated aryl, halogenated hetero-aryl, alkylsulfonyl-oxy, halogenated alkylsulfonyl-oxy, or substituted or unsubstituted arylsulfonyl-oxy.

8. A radiation-sensitive recording medium comprising a substrate and a coating layer formed on said substrate and made of said radiation-sensitive composition according to claim 1.

9. A radiation-sensitive composition comprising:

an acid-generating compound capable of generating an acid upon exposure to radiation and represented by the formula (I):

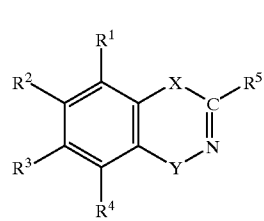
(I)

wherein X, Y and $R^1$ to $R^5$ have the following meanings:

X and Y: independently a direct bond, $C_1$–$C_{18}$ alkylene, $C_1$–$C_4$ alkene, —O—$R^{11}$—O— (wherein $R^{11}$ is an alkylene group having 1 to 4 carbon atoms), —NH—, —O—, —S—, —$SO_2$—, —CO—, —COO— or —CONR$^{12}$— (wherein $R^{12}$ is a hydrogen atom, $C_1$–$C_{18}$ alkyl, alkylaryl, halogenated alkyl, halogenated aryl, a halogen atom, alkoxy, phenoxy, alkylsulfonyl-oxy, halogenated alkylsulfonyl-oxy, or substituted or unsubstituted arylsulfonyl-oxy);

$R^1$ to $R^4$: a hydrogen atom, $C_1$–$C_{18}$ alkyl, aryl, hetero-aryl, a halogen atom, amino which may be substituted by an alkyl or aryl, amide which may be substituted by alkyl or aryl, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated alkyl, halogenated aryl, halogenated hetero-aryl, alkylsulfonyl-oxy, halogenated alkylsulfonyl-oxy, or substituted or unsubstituted arylsulfonyl-oxy;

a water-insoluble but aqueous alkaline solution-soluble binder comprising a water-insoluble but alkaline solution-soluble binder comprising a homopolymer or copolymer of p-hydroxystyrene or p-hydroxystyrene with one or more alkyl substituents on its benzene ring for deep UV sensitive compositions; and a cross-linking compound capable of reacting with said binder in the presence of said acid to cause the binder to be cross-linked.

10. A radiation-sensitive composition comprising:

an acid-generating benzimidazole compound capable of generating an acid upon exposure to radiation and represented by the formula (III):

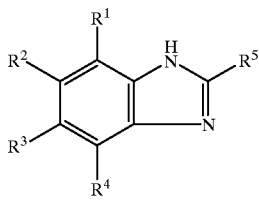

(III)

wherein $R^1$ to $R^5$ have the following meanings:

$R^1$ to $R^4$: a hydrogen atom, $C_1$–$C_{18}$ alkyl, aryl, hetero-aryl, a halogen atom, amino which may be substituted by an alkyl or aryl, amide which may be substituted by alkyl or aryl, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated alkyl, halogenated aryl, halogenated hetero-aryl, alkylsulfonyl-oxy, halogenated alkylsulfonyl-oxy, or substituted or unsubstituted arylsulfonyl-oxy;

a water-insoluble but aqueous alkaline solution-soluble binder comprising (i) novolak resins for X-ray or electron beam sensitive compositions or (ii) a water-insoluble but alkaline solution-soluble binder comprising a homopolymer or copolymer of p-hydroxystyrene or p-hydroxystyrene with one or more alkyl substituents on its benzene ring for deep UV sensitive compositions; and a cross-linking compound capable of reacting with said binder in the presence of said acid to cause the binder to be cross-linked.

11. A radiation-sensitive composition comprising:

an acid-generating quinazolinone or quinoline compound capable of generating an acid upon exposure to radiation and represented by the formulae (IV) and (V), respectively:

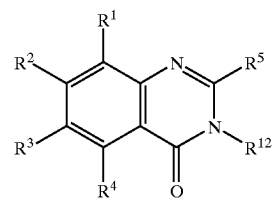

(IV)

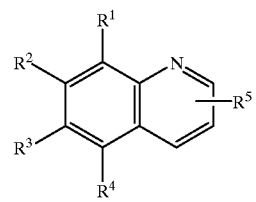

(V)

wherein $R^1$ to $R^5$ and $R^{12}$ have the following meanings:

$R^1$ to $R^4$: a hydrogen atom, $C_1$–$C_{18}$ alkyl, aryl, hetero-aryl, a halogen atom, amino which may be substituted by an alkyl or aryl, amide which may be substituted by alkyl or aryl, nitro, cyano, aldehyde, acetal, alkoxy, phenoxy, alkylsulfonyl-oxy, or substituted or unsubstituted arylsulfonyl-oxy;

$R^5$: a hydrogen atom, alkyl, aryl, halogenated aryl, halogenated hetero-aryl, alkylsulfonyl-oxy, halogenated alkylsulfonyl-oxy, or substituted or unsubstituted arylsulfonyl-oxy;

$R^{12}$: a hydrogen atom, $C_1$–$C_{18}$ alkyl, alkylaryl, halogenated alkyl, halogenated aryl, a halogen atom, alkoxy, phenoxy, alkylsulfonyl-oxy, halogenated alkylsulfonyl-oxy, or substituted or unsubstituted arylsulfonyl-oxy;

a water-insoluble but aqueous alkaline solution-soluble binder comprising (i) novolak resins for X-ray or electron beam sensitive compositions or (ii) a water-insoluble but alkaline solution-soluble binder comprising a homopolymer or copolymer of p-hydroxystyrene or p-hydroxystyrene with one or more alkyl substituents on its benzene ring for deep UV sensitive compositions; and a cross-linking compound capable of reacting with said binder in the presence of said acid to cause the binder to be cross-linked.

* * * * *